(12) United States Patent
Yoo et al.

(10) Patent No.: US 9,793,103 B2
(45) Date of Patent: *Oct. 17, 2017

(54) EPOXY-BASED COMPOSITION, ADHESIVE FILM, DICING DIE-BONDING FILM AND SEMICONDUCTOR DEVICE

(71) Applicant: LG CHEM, LTD., Seoul (KR)

(72) Inventors: Hyun Jee Yoo, Daejeon (KR); Dong Han Kho, Daegu (KR); Jang Soon Kim, Daejeon (KR); Hyo Soon Park, Daejeon (KR); Jong Wan Hong, Daejeon (KR); Hyo Sook Joo, Daejeon (KR)

(73) Assignee: LG Chem, Ltd., Seoul (KR)

( * ) Notice: Subject to any disclaimer, the term of this patent is extended or adjusted under 35 U.S.C. 154(b) by 33 days.

This patent is subject to a terminal disclaimer.

(21) Appl. No.: 13/915,176

(22) Filed: Jun. 11, 2013

(65) Prior Publication Data

US 2013/0281571 A1    Oct. 24, 2013

Related U.S. Application Data

(63) Continuation of application No. 12/989,353, filed as application No. PCT/KR2009/002150 on Apr. 24, 2009, now Pat. No. 9,659,763.

(30) Foreign Application Priority Data

Apr. 25, 2008  (KR) .................. 10-2008-0038700

(51) Int. Cl.
*H01L 21/02*  (2006.01)
*C09J 5/06*  (2006.01)
(Continued)

(52) U.S. Cl.
CPC ...... *H01L 21/02002* (2013.01); *C08G 59/621* (2013.01); *C08K 5/13* (2013.01);
(Continued)

(58) Field of Classification Search
None
See application file for complete search history.

(56) References Cited

U.S. PATENT DOCUMENTS 3,579,490 A * 5/1971 kordzinski ............ C08F 218/08
526/227
3,601,079 A * 8/1971 Giles et al. ................ 114/67 R
(Continued)

FOREIGN PATENT DOCUMENTS

CN    1400993    3/2003
CN    1806326    7/2006
(Continued)

OTHER PUBLICATIONS

Milex XLC series data sheet (viewable at http://www/mitsuichemicals.com/mile_9.htm) (2013).*
(Continued)

*Primary Examiner* — Frank D Ducheneaux
(74) *Attorney, Agent, or Firm* — Dentons US LLP

(57) ABSTRACT

Provided are an epoxy composition, an adhesive film, a dicing die bonding film and a semiconductor device using the same. Specifically, the epoxy composition and a use thereof are provided, wherein the epoxy composition has a gel content of 5~20%, measured under certain conditions. The epoxy composition according to the present invention, as an adhesive agent, shows excellent elastic properties, when prepared to have a low glass transition temperature, exhibiting good adhesion at high temperature and having minimal occurrence of burrs during processing. According to the present invention, it is therefore possible to prevent (Continued)

defects owing to die cut shift, during a wire bonding or molding process at high temperature, and obtain a highly reliable semiconductor device owing to the excellent adhesiveness and workability of the adhesive agent.

13 Claims, 2 Drawing Sheets

(51) Int. Cl.
C09J 163/00 (2006.01)
C09J 133/14 (2006.01)
C09J 133/02 (2006.01)
C08K 5/13 (2006.01)
C08L 61/06 (2006.01)
C08L 61/12 (2006.01)
C08L 61/20 (2006.01)
C08L 63/00 (2006.01)
C09J 133/06 (2006.01)
C08L 33/06 (2006.01)
C08G 59/62 (2006.01)
H01L 21/683 (2006.01)
C09J 7/02 (2006.01)

(52) U.S. Cl.
CPC ............ C08L 33/066 (2013.01); C08L 61/06 (2013.01); C08L 61/12 (2013.01); C08L 61/20 (2013.01); C08L 63/00 (2013.01); C09J 133/066 (2013.01); C09J 133/068 (2013.01); C09J 163/00 (2013.01); C08L 33/068 (2013.01); C09J 5/06 (2013.01); C09J 7/02 (2013.01); C09J 2201/36 (2013.01); C09J 2201/60 (2013.01); C09J 2203/326 (2013.01); C09J 2433/00 (2013.01); C09J 2463/00 (2013.01); H01L 21/6836 (2013.01); Y10T 428/269 (2015.01); Y10T 428/287 (2015.01); Y10T 428/2891 (2015.01); Y10T 428/31515 (2015.04)

(56) References Cited

U.S. PATENT DOCUMENTS

| | | | |
|---|---|---|---|
| 4,340,104 A * | 7/1982 | Kuan | 152/521 |
| 4,806,590 A * | 2/1989 | Padget et al. | 524/568 |
| 4,857,218 A * | 8/1989 | Meschke et al. | 508/223 |
| 5,035,945 A * | 7/1991 | Hart | B32B 27/30 428/323 |
| 5,281,667 A | 1/1994 | Khouri et al. | |
| 5,389,701 A | 2/1995 | Erickson | |
| 5,604,035 A * | 2/1997 | Kojima | C08F 220/28 428/343 |
| 6,319,557 B1 | 11/2001 | Ikushima et al. | |
| 6,369,123 B1 * | 4/2002 | Stark et al. | 522/36 |
| 6,369,293 B1 * | 4/2002 | Reeves et al. | 604/372 |
| 6,383,659 B1 * | 5/2002 | Honda | C08G 59/3218 257/E21.503 |
| 6,399,671 B1 * | 6/2002 | Hoch et al. | 522/152 |
| 6,630,239 B2 * | 10/2003 | Cernohous et al. | 428/355 R |
| 6,784,228 B2 | 8/2004 | Ogura et al. | |
| 2002/0004134 A1 | 1/2002 | Shima et al. | |
| 2002/0061948 A1 * | 5/2002 | Murakami et al. | 524/317 |
| 2002/0161100 A1 | 10/2002 | Kojima et al. | |
| 2003/0069331 A1 | 4/2003 | Teiichi et al. | |
| 2005/0234169 A1 | 10/2005 | Kim et al. | |
| 2006/0088670 A1 | 4/2006 | Kim et al. | |
| 2006/0154066 A1 | 7/2006 | Kita et al. | |
| 2007/0026572 A1 | 2/2007 | Hatakeyama et al. | |
| 2007/0141330 A1 | 6/2007 | Morishima et al. | |
| 2007/0244259 A1 * | 10/2007 | Lee et al. | 525/168 |
| 2008/0033095 A1 * | 2/2008 | Takahashi et al. | 524/460 |

FOREIGN PATENT DOCUMENTS

| | | |
|---|---|---|
| EP | 0928016 | 7/1999 |
| JP | 08-053655 | 2/1996 |
| JP | 09-310050 A | 12/1997 |
| JP | 10-046114 | 2/1998 |
| JP | 2003-082306 | 3/2003 |
| JP | 2006-117824 | 5/2006 |
| JP | 2007-103954 | 4/2007 |
| JP | 2010-508386 | 3/2010 |
| JP | 2011-506669 | 3/2011 |
| KR | 10-1999-0007508 | 4/2000 |
| KR | 10-2008-0065844 A | 7/2008 |
| TW | 200513509 | 4/2005 |

OTHER PUBLICATIONS

B-Stage Epoxy definition (available at http://www.epotek.com/SSCDocs/techtips/Tech%20Tip%2020%20-%20B-stage%20Epoxy.pdf) (2013).*

Milex XLC series data sheet (viewable at http://www.mitsuichemicals.com/mile_9.htm) (2013).

B-Stage Epoxy definition (available at http://www/epotek.com/SSCDocs/techtips/Tech%20Tip%2020%20-%20B-state%20Epoxy/pdf) (2013).

* cited by examiner

EPOXY-BASED COMPOSITION, ADHESIVE FILM, DICING DIE-BONDING FILM AND SEMICONDUCTOR DEVICE

This application is a Continuation of U.S. patent application Ser. No. 12/989,353 filed Oct. 22, 2010, which is the U.S. National Phase application of International Application No. PCT/KR2009/002150 filed on Apr. 24, 2009, which claims the benefit of Korean patent Application No. 10-2008-0038700, filed Apr. 25, 2008, in the Korean Intellectual Property Office, the disclosure of which is incorporated herein in their entirety by reference for all purposes as if fully set forth herein.

TECHNICAL FIELD

The present invention relates to an epoxy composition, an adhesive film containing a cured product of the composition, a dicing die bonding film and a semiconductor device.

BACKGROUND ART

Semiconductor chip fabrication processes generally include a micropattern-forming process on a wafer and a packaging process wherein a wafer is ground to the size of a final device.

The packaging process includes: a wafer testing process during which defective semiconductor chips are inspected; a dicing process in which a wafer is cut into individual chips; a die bonding process wherein the separate chips are attached to a mounting board of a circuit film or lead frame; a wire bonding process wherein a chip pad provided on a semiconductor chip is connected with a circuit pattern of the circuit film or lead frame via electrical connecting means such as wire; a molding process wherein the exterior of the semiconductor is wrapped with an enveloping material in order to protect the internal circuit and other parts of the semiconductor chip; a trimming process wherein a dam bar connecting leads is broken; a forming process wherein the leads are bent to obtain a desired form; and a final product testing process to inspect defects in a packaged product.

In a dicing process, a wafer is cut to a certain thickness by means of a diamond wheel or the like. Before dicing, a dicing die bonding film is laminated, under suitable temperature conditions, on the backside of a wafer in which patterns are not formed, in order to fix the wafer.

A dicing die bonding film generally includes a dicing tape and a die bonding film layered on the dicing tape. To the backside of a wafer which has no patterns, a die bonding film is used. In a dicing process, the whole wafer, and a part of a die bonding film and a dicing tape are cut using a diamond wheel (blade).

In such a dicing process, excessive pressure or mechanical impact is likely to be applied to a wafer, damaging or chipping the wafer, so that burrs which may cause contamination in the patterns frequently occur. As the thickness of wafers is being less, and with the tendency of small size packaging and severe dicing conditions to improve the production efficiency, problems caused by burrs or the like have been occurring more frequently. Particularly, with the use of a thinner wafer, burrs protrude to a level which did not used to cause a problem in the past, but now often stand out from the die causing defective products.

A conventional technique for reducing such burrs is to adjust a dicing tape and a die bonding film, specifically, a method for increasing the elasticity of a die bonding film.

Korean laid-open patent application No. 1999-7508 discloses an epoxy composition comprised of resinous components including an epoxy resin, a hardening agent, a diluent, a hardening accelerating agent and a thixotropic agent and an inorganic filler. The invention describes that the composition exhibits suitable elasticity which does not cause defects in wire bonding and has satisfactory adhesion strength. Japanese laid-open patent application No. 1998-46114 discloses a film type adhesive containing an adhesive layer comprising an adhesive resin of which the glass transition temperature (Tg) is 50° C. to 250° C. and, based on the weight of the adhesive resin (100 parts by weight), 10-400 parts by weight of an elastic filler.

The above-mentioned techniques are methods for increasing the film elasticity by increasing: the glass transition temperature of a thermoplastic resin contained in a die bonding film; the filler content; or the softening temperature of an epoxy or hardening agent. According to the foregoing methods, it is possible to increase the film elasticity; however, it causes deterioration in adhesive properties. Therefore, a film will not be attached to the back of a wafer, or after adhesion, the tack properties thereof are significantly reduced during a wire bonding or molding process, lowering workability and reliability in semiconductor fabrication.

DISCLOSURE

Technical Problem

The present invention has been designed to solve the above problems. The object of the present invention is to provide an epoxy composition, an adhesive film, a dicing die bonding film, a semiconductor wafer and a semiconductor device containing said composition, which has excellent elastic properties so that the problems such as the occurrence of burrs can be resolved, while maintaining good reliability and workability during the semiconductor fabrication process.

Technical Solution

In order to solve the foregoing object, the present invention provides an epoxy composition satisfying the following general formula 1:

$$X=5\% \text{ to } 20\% \qquad \text{[General formula 1]}$$

wherein X is the content of a gel measured after drying the above-described epoxy composition at a temperature of 110° C. for 3 minutes.

Further, as another means for satisfying said object, the present invention provides an adhesive film comprising a base film and an adhesive layer that is formed on the base film and comprises a cured product of the epoxy composition according to the present invention.

Still further, the present invention provides a dicing die bonding film comprising a dicing tape, and an adhesive portion that is formed on the dicing tape and comprises a cured product of the epoxy composition according to the present invention.

Further, the present invention provides a semiconductor wafer, in which the adhesive portion of the dicing die bonding film is attached to one side of the wafer, and the dicing tape is fixed on a wafer ring frame.

Still further, the present invention provides a semiconductor device comprising: a wiring board; an adhesive layer that is attached to a chip mounting side of the wiring board and comprises a cured product of the epoxy composition according to the present invention; and a semiconductor chip mounted on the adhesive layer.

Advantageous Effects

An adhesive prepared by using the epoxy composition of the present invention shows excellent elastic properties even when its glass transition temperature is controlled to be low, so that it can minimize the occurrence of burrs during a semiconductor packaging process. Also, according to the present invention, it is possible to prevent defects such as die shifting, during processes at a high temperature such as a wire bonding or molding process, and it is possible to obtain a highly reliable semiconductor device owing to the excellent adhesiveness and workability of the adhesive agent.

<Numerals>

Figure 1:
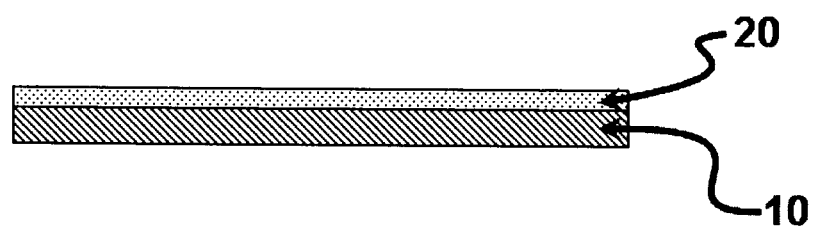
FIG. 1 is a cross-sectional view of an adhesive film according to one embodiment of the present invention.

| | |
|---|---|
| 1: semiconductor chip | 2: wiring board |
| 10: base film | 20: adhesive layer |
| 30: dicing tape | 40: adhesive portion |
| 50: base film | 60: pressure-sensitive adhesive |

Best Mode

The present invention relates to an epoxy composition, that satisfies the following general formula 1.

X=5% to 20%  [General formula 1]

wherein X is the content of a gel measured after drying the above epoxy composition at a temperature of 110° C. for 3 minutes.

Hereinafter, the epoxy composition is further described.

In the present invention, the gel content measured after preparing a composition by blending each component to be included in the epoxy composition and drying it under predetermined certain conditions is controlled.

In one embodiment of the present invention, the gel content may be measured right after the epoxy composition is coated on a base film. Accordingly, in the present invention, an adhesive prepared from the epoxy composition may have excellent elastic properties, even when the glass transition temperature of thermoplastic resins contained therein is maintained to be low.

The term [gel] as used herein refers to a component remaining and being swollen without being completely dissolved after drying the epoxy composition, soaking it into THF (tetrahydrofuran), which is a solvent having high permeability, and then maintaining it at 25° C. for 20 hours.

In one embodiment, the gel content may be measured by the following method. Firstly, a composition is prepared by blending each component, and then drying at a temperature of 110° C. for 3 minutes. Then, a certain amount (weight: $W_2$) of the dried product is collected, placed in a basket-shaped 300-mesh SUS (weight: $W_1$), soaked in THF, and maintained therein at 25° C. for 20 hours. It is preferred that the SUS mesh is soaked in THF just at the level of soaking the dried product, not the entire SUS mesh. After that, the SUS mesh is taken out of the THF and sufficiently dried to evaporate all the THF. There will be a swollen component of the dried product (SUS mesh weight+weight of the swollen component of the dried product=$W_3$) left in the SUS mesh, which is not dissolved in THF. Each weight measured during the above procedure is used in the following general formula 2 to obtain the gel content.

$$Gel content (\%) = \frac{W_3 - W_1}{W_2} \times 100 \quad \text{[General formula 2]}$$

The gel content of the epoxy composition as measured above may be 5% to 20%, but preferably not less than 5% and less than 20%, and more preferably 5% to 15%. When the gel content is less than 5%, the elastic properties of the present composition deteriorate, which may cause the occurrence of burrs in a semiconductor fabrication process, or the shear strength is lowered, which may result in defects such as die shifting. Further, when the gel content is more than 20%, the properties for filling a circuit are lowered, or the adhesive properties are reduced too much, which may lower the reliability of a semiconductor package.

As long as the epoxy composition satisfies the above gel content, the components thereof are not specifically restricted. For example, the present invention may use a composition comprising (a) a thermoplastic resin, (b) an epoxy resin, and (c) a hardening agent.

The (a) thermoplastic resin is not specifically limited as long as it has a sufficiently high molecular weight; it may be maintained in the form of a film without being broken before a curing (hardening) process; it may react with (b) and (c) components during the curing process; and it may maintain its viscoelasticity after the curing process.

In one embodiment of the present invention, in order to embody the composition satisfying the above gel content, a (a) thermoplastic resin having an internally-crosslinked structure or an internally-entangled structure may be preferably used.

The term [thermoplastic resin having an internally-cross-linked structure] as used herein refers to a structure in which parts of cross-linkable functional groups contained in the thermoplastic resin form a cross-linking structure through a self-crosslinking reaction, and the other parts remain un-reacted. The un-reacted cross-linkable functional groups may react with other components of the composition such as the (b) epoxy resin and/or the (c) hardening agent during a drying process. Specifically, for example, when a glycidyl group is introduced to the (a) resin as a functional group which has good compatibility with the (b) epoxy resin, and is able to induce a reaction with the (c) hardening agent, and a carboxyl group is further introduced to impart adhesiveness, parts of the carboxyl group and the glycidyl group may react with (b) the epoxy resin and (c) the hardening agent during a drying process after preparation of a varnish, form a gel right after drying, and thereby improve the elastic properties of the resulting adhesive.

The thermoplastic resin having an internally-crosslinked structure may be prepared by, when polymerizing the resin, using two species or more species of monomer pairs having functional groups, for example, a glycidyl group-containing monomer and a carboxyl group-containing monomer, wherein the functional groups can react together so as to form an internal cross-linking structure during polymerization, and controlling the polymerization time so as to achieve the internal cross-linking structure to a suitable degree. An ordinarily skilled person in this field may easily determine suitable reaction conditions and monomers, considering various parameters such as the degree of cross-linking and the content of un-reacted functional groups in the thermoplastic resin.

The term [thermoplastic resin having an internally-entangled structure] as used herein refers to a state when a thermoplastic resin having sufficiently long chains is entangled, not by chemical bonding, but by physical interaction. Such an internally-entangled thermoplastic resin can be prepared, for example, by excluding a pair of functional groups which can react to each other in the resin, i.e. controlling the functional groups contained in the resin so as not to react each other, and controlling the dilution time in a solvent. For example, the resin may be prepared by solution polymerization, photo polymerization, bulk polymerization, emulsion polymerization or suspension polymerization. In one embodiment, in order to obtain the internally-entangled thermoplastic resin, suspension polymerization may be used. In suspension polymerization, polymerization is conducted such that monomers are dispersed in an inactive medium, resulting in a resin in the shape of a bead upon completion of the reaction. After preparing a resin, it is generally diluted in a solvent so as to prepare a coating solution. For sufficient dissolution of the resin in the solvent, 3 to 10 days are generally needed. At this time, if the functional groups in the resin are controlled so as to not react with each other, and the dilution time in the solvent is maintained so as to be sufficiently short, the resin may remain entangled, even though the solvent permeates into the resin, for example polymer beads.

In one embodiment of the present invention, the time taken for dilution of a thermoplastic resin into a solvent may be controlled to be 5 hours or more and less than 3 days, preferably 8 hours to 2 days, and more preferably about 10 hours to 24 hours. When the dilution time is less than 5 hours, the solvent cannot sufficiently permeate into the inside of the resin such as polymer beads, so it is not possible to get a heterogeneous resin solution. When it is not less than 3 days, the thermoplastic resin may be disentangled so that appropriate properties cannot be embodied.

The (a) thermoplastic resin having an internally-cross-linked or internally-entangled structure may have a glass transition temperature of −30° C. to 50° C., preferably −20° C. to 40° C., and more preferably −15° C. to 20° C. When the glass transition temperature is less than −30° C., the tack properties are excessively improved at the time of film formation, so the handling property deteriorates. When it is more than 50° C., adhesiveness is lowered in the vicinity of 60° C., which is a temperature that an adhesive film is generally attached to a wafer, therefore it is possible that chips are scattered during a dicing process, or cleansing water permeates between the adhesive and the chip, lowering the reliability of the resulting semiconductor package.

The (a) thermoplastic resin having an internally-cross-linked or internally-entangled structure may have a weight average molecular weight ($M_W$) of 100,000 to 2,500,000, and preferably 100,000 to 1,500,000. When the weight average molecular weight of the (a) thermoplastic resin is less than 100,000, the strength of an adhesive film is reduced, thereby possibly deteriorating the heat resistance and handling properties, or making it difficult to control flowability at the time of circuit filling of a semiconductor substrate. When it is more than 2,500,000, the elasticity of an adhesive layer becomes excessively high and flowability is lowered, thereby possibly deteriorating a circuit filling property and the reliability of the adhesive film. In the meantime, when the (a) thermoplastic resin has an internally-entangled structure, it is preferable to have a weight average molecular weight of about 500,000 or more. When the weight average molecular weight is less than 500,000, the chain length of the resin may become too short to form the entangled structure in an efficient way.

The species of the (a) thermoplastic resin which may be used in the present invention are not specifically limited as long as it has the above-described properties. Exemplary (a) thermoplastic resins which may be used in the present invention may include resins containing at least one functional group selected from glycidyl, hydroxy, carboxyl or nitrogen-containing functional groups such as nitrile. Among them, a glycidyl and/or carboxyl group may be used in one embodiment of the present invention, considering compatibility with an epoxy resin as described later and the adhesion properties.

In one embodiment of the present invention, the (a) thermoplastic resin may be a copolymer of a (meth)acrylic ester monomer and a monomer that contains the above-described functional groups (hereinafter, it may be referred to as a [functional group-containing monomer]).

The types of (meth)acrylic ester monomer which may be used in the present invention are not specifically limited, and, for example, alkyl (meth)acrylate may be used. At this time, if the number of carbons included in an alkyl group of the alkyl (meth)acrylate is excessively high, thus forming a long chain, the cohesion of an adhesive may be reduced and control of glass transition temperature and cohesion may become difficult. Therefore, it is preferable to use an alkyl (meth)acrylate of which the alkyl group has 1 to 14 carbon atoms, and preferably 1 to 12 carbon atoms. Examples of such monomers may be one or more selected from the group consisting of methyl (meth)acrylate, ethyl (meth)acrylate, n-propyl (meth)acrylate, isopropyl (meth)acrylate, n-butyl (meth)acrylate, t-butyl (meth)acrylate, sec-butyl (meth)acrylate, pentyl (meth)acrylate, 2-ethylhexyl (meth)acrylate, n-octyl (meth)acrylate, isooctyl (meth)acrylate, isononyl (meth)acrylate, isobornyl (meth)acrylate, lauryl (meth)acrylate, and tetradecyl (meth)acrylate, without being specifically limited to these examples.

The species of the functional-group containing monomers contained in the (a) thermoplastic resin are not specifically limited. As exemplary monomers, they may be one or more selected from the group consisting of glycidyl group-containing monomers, hydroxyl group-containing monomers, carboxyl group-containing monomers and nitrogen group-containing monomers. For preparing a thermoplastic resin having an internally-crosslinked structure, it is preferable to use monomers having functional groups that are capable of reacting with each other and forming cross-linkages. Examples of such a pair of functional groups being capable of self-crosslinking are a glycidyl group and a carboxyl group; or a glycidyl group and a hydroxyl group.

The glycidyl-group containing monomers may be glycidyl (meth)acrylate, epoxyalkyl (meth)acrylate (wherein, alkyl may be an alkyl group having 1 to 4 carbon atoms), or epoxycycloalkylalkyl (meth)acrylate such as 3,4-epoxycyclohexylmethyl (meth)acrylate. The hydroxyl-group containing monomers may be glycerol (meth)acrylate, 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 2-hydroxyethyleneglycol (meth)acrylate, or 2-hydroxypropyleneglycol (meth)acrylate. The carboxyl-group containing monomers may be (meth)acrylic acid, 2-(meth)acryloyloxyacetic acid, 3-(meth)acryloyloxy propionic acid, 4-(meth)acryloyloxy butyric acid, acrylic acid dimer, itaconic acid, maleic acid or maleic anhydride. The nitrogen-containing monomers may be (meth)acrylonitrile, (meth)acrylamide, N-methyl(meth) acrylamide or N-methylol (meth)acrylamide. The species of monomers are not restricted to the above-mentioned examples.

The content of the functional-group containing monomers in the (a) thermoplastic resin is not specifically limited. However, it is preferable to have 0.5 to 20 parts by weight of the functional group, and preferably 1 to 15 parts by weight, based on 100 parts by weight of the total resin. When the content of functional groups is less than 0.5 parts by weight, the adhesion properties are possibly lowered. When it is more than 20 parts by weight, the workability and/or stability during storage may be lowered.

The epoxy composition of the present invention comprises (b) an epoxy resin, together with (a) the thermoplastic resin. The (b) epoxy resin which can be used in the present invention is not specifically limited, as long as it contains 2 or more epoxy groups in the backbone chain, and has a glass transition temperature of 50° C. or more. However, it is preferable to use an epoxy resin containing repeating units of an aromatic structure in the backbone chain, in terms that excellent adhesiveness, heat resistance and mechanical strength can be imparted to the composition owing to the formation of a cross-linking structure in a hardening process.

The (b) epoxy resin used in the present invention preferably has an intrinsic softening temperature (before hardening) of 50° C. to 100° C. When the softening temperature is less than 50° C., the elastic modulus of an adhesive film at an A-stage may be reduced, or the tack properties may increase excessively, thereby deteriorating the handling property. When it is more than 100° C., adhesion to a wafer is reduced, possibly causing chip scattering when dicing.

The (b) epoxy resin preferably has an average epoxy equivalent weight of 180 to 1,000. When the epoxy equivalent weight is less than 180, the cross-linking density may be excessively increased, possibly hardening the entire adhesion film. When it is more than 1,000, the glass transition temperature may be lowered too much, possibly reducing heat resistance.

Examples of the (b) epoxy resins may include, cresol novolak epoxy resins, bisphenol A type novolak epoxy resins, phenol novolak epoxy resins, 4-functional epoxy resins, biphenyl type epoxy resins, triphenolmethane type epoxy resins, alkyl-modified triphenolmethane type epoxy resins, naphthalene type epoxy resins, dicyclopentadiene type epoxy resins or dicyclopentadiene-modified phenol type epoxy resins. Among them, one or a mixture of two or more may be used, without being limited thereto.

It is preferable that (b) an epoxy resin is used at the amount of 10 to 200 parts by weight, and more preferably 20 to 100 parts by weight, relative to 100 parts by weight of the (a) a thermoplastic resin. When the amount is less than 10 parts by weight, heat resistance and/or handling properties may be lowered. When it is more than 200 parts by weight, the rigidity of a film becomes too great, possibly lowering the workability and/or handling properties.

The (c) hardening agent is not specifically limited, as long as it can form a cross-linking structure together with the above components (a) and/or (b). In one embodiment of the present invention, (c) the hardening agent may react with both components (a) and (b), so as to form cross-linking structures. The hardening agent forms a cross-linking structure with the (a) thermoplastic resin constituting a soft segment in a cured product, and the (b) epoxy resin constituting a hard segment in a cured product, respectively, thereby increasing heat resistance and at the same time being served as a connecting loop at the interface between (a) and (b), and improving the reliability in a semiconductor package.

Particularly, the (c) hardening agent may be a polyfunctional phenol resin, preferably a polyfunctional phenol resin having a hydroxy equivalent weight of 100 to 1,000. When the hydroxy equivalent weight is less than 100, the hardened product of an epoxy resin may become hard, thus possibly deteriorating a buffering property of a semiconductor package. When it is more than 1,000, the cross-linking density will be reduced, thus possibly lowering heat resistance.

In one embodiment of the present invention, the (c) hardening agent may have a softening temperature of 50° C. to 150° C. When the softening point of (c) a hardening agent is less than 50° C., the handling property and/or heat resistance may be reduced owing to increased tack property. When it is more than 150° C., the hardness of an adhesive film increases excessively, thus possibly causing deterioration in adhesion to a wafer or chip scattering during dicing.

Examples of a phenol resin may be bisphenol A resin, phenol novolak resin, cresol novolak resin, bisphenol A novolak resin, phenol aralkyl resin, multifunction novolak resin, dicyclopentadiene phenol novolak resin, amino triazine phenol novolak resin, polybutadiene phenol novolak resin or biphenyl type resin, and one or more mixtures thereof.

In one embodiment of the present invention, the (c) hardening agent may be used in the present composition at an equivalent ratio of 0.4 to 2, and preferably 0.8 to 1.2, relative to the epoxy equivalent weight of the (b) epoxy resin. When the equivalent ratio is less than 0.4, epoxy groups remaining unreacted after a hardening process increase, and thus reduce the glass transition temperature and heat resistance. To prevent such problems, it should be kept at a high temperature for a long period to allow further reaction of the unreacted epoxy groups. When the equivalent ratio is more than 2, moisture absorption, stability during storage and/or dielectric properties may deteriorate, owing to unreacted hydroxy groups.

In addition to the above-described components, the epoxy composition of the present invention may further comprise one or more selected from the group consisting of an inorganic filler, a hardening accelerating agent and a coupling agent.

To improve the handling property, heat resistance and thermal conductivity and adjusting the melt viscosity, an inorganic filler may be added. Examples include silicon dioxide, titanium dioxide, aluminum hydroxide, calcium carbonate, magnesium hydroxide, aluminum oxide, talc or aluminum nitride, or one or more mixtures thereof, without being limited to these.

A hardening accelerating agent is added to adjust the time taken for the hardening process, without being specifically limited. It may include, for example, tertiary amines, imidazole compounds, quaternary ammonium or triphenyl phosphine, or one or more mixtures thereof.

A coupling agent is added to improve close adhesion between an adhesive film and a wafer, and/or binding between an adhesive element and an inorganic filler. The organic functional groups in a coupling agent react with resin components during a hardening reaction, thereby increasing adhesiveness, close adhesiveness and moisture and heat resistance without affecting the heat resistance. Exemplary coupling agents may include silane coupling agents, titan coupling agents and aluminum coupling agents, and one or two or more mixtures thereof. In terms of cost-effectiveness, silane coupling agents are preferably used, without being limited to this.

The present invention further relates to an adhesive film comprising a base film and an adhesive layer that is formed on the base film and comprises a cured product of the epoxy composition according to the present invention.

The term [cured product of the epoxy composition] as used herein refers to a state when the epoxy composition is in the form of an adhesive after going through a curing (hardening) process such as a drying process.

FIG. 1 is a view showing an adhesive film according to one embodiment of the present invention. As shown in FIG. 1, the adhesive film of the present invention may comprise a base film 10 and an adhesive layer 20 formed on the base film 10. However, the film shown in FIG. 1 is only an embodiment of the present invention. As the case may be, the adhesive film of the present invention may have adhesive layers formed on both sides of the base film, forming a double-sided adhesive film, or may be made of only an adhesive agent, without using a base film.

The species of a base film used in an adhesive film of the present invention are not specifically limited, and may include plastic films, for example, made of polyethyleneterephthalate, polytetrafluoroethylene, polyethylene, polypropylene, polybutene, polybutadiene, a copolymer of vinyl chloride or polyimide. In one embodiment of the present invention, the surface of the base film may be treated with releasing agents. Exemplary releasing agents may include alkyd-, silicon-, fluorine-, unsaturated ester-, polyolefin- or wax-based releasing agents. Among them, alkyd-, silicon- or fluorine-based releasing agents are preferably used because of heat resistance, without being restricted to these.

The thickness of a base film is not specifically limited, however it is generally 10 μm to 500 μm, and preferably 20 μm to 200 μm. When the thickness is less than 10 μm, the base film is likely to be deformed, possibly causing unevenness on the adhesive layer. When it is more than 500 μm, it is not economical.

The adhesive layer in the adhesive film comprises a cured product of the epoxy composition according to the present invention. Therefore, it exhibits excellent elastic properties and adhesiveness at high temperature, although the glass transition temperature thereof is set to be low. Although the thickness of the adhesive layer in the present invention is not specifically limited, it is preferably 5 μm to 200 μm, and more preferably 10 μm to 100 μm. When the thickness is less than 5 μm, a stress buffering effect at high temperature and filling property may be reduced, and when it is more than 200 μm, it is not economical. A method for preparing an adhesive film in accordance with the present invention as described above is not specifically limited.

For instance, the adhesive film of the present invention may be prepared by a method, comprising: a $1^{st}$ step of preparing a resin varnish by dissolving or dispersing an epoxy composition of the present invention into a solvent; a $2^{nd}$ step of applying the resin varnish to a base film; and a $3^{rd}$ step of heating the base film coated with the resin varnish so as to remove the solvent.

The species of a solvent for the preparation of a resin varnish in the $1^{st}$ step are not specifically limited, and solvents generally used in this field may be used, for example methylethylketone (MEK), acetone, toluene, dimethylformamide (DMF), methyl cellosolve (MCS), tetrahydrofuran (THF) or N-methylpyrrolidone (NMP), or one or more mixtures thereof. In terms of heat resistance of a base film, it is preferable to use a low boiling point solvent, however a high boiling point solvent may also be preferably used in terms of improvement in evenness of a coating film.

In the $1^{st}$ step, in order to reduce the processing time or improving dispersibility in the adhesive film, a filler may be used. In this case, the $1^{st}$ step may comprise the steps of: (a) blending a solvent, a filler and a coupling agent; (b) adding an epoxy resin and a phenol resin to the mixture from step (a) and mixing them together; and (c) further adding and mixing a thermoplastic resin and a hardening accelerating agent to the mixture from step (b).

Exemplary fillers may include ball mill, bead mill, 3-roll, or high speed mill, alone or in a combination of two or more thereof. Materials for the ball or bead are glass, alumina or zirconium. Among them, a ball or bead made of zirconium is preferred in respect to particle dispersion.

In the $2^{nd}$ step, to coat a resin varnish over a base film, any well-known method in this field of art may be used without limitation, for example, knife coating, roll coating, spray coating, gravure coating, curtain coating, comma coating or lip coating.

In the $3^{rd}$ step, the base film coated with a resin varnish is heated to form an adhesive film, wherein the heating is preferably conducted at 70° C. to 250° C. for 1 minute to 10 minutes, without being limited thereto.

Further, the present invention relates to a dicing die bonding film comprising a dicing tape, and an adhesive portion that is formed on the dicing tape and comprises a cured product of the epoxy composition according to the present invention.

Figure 2:
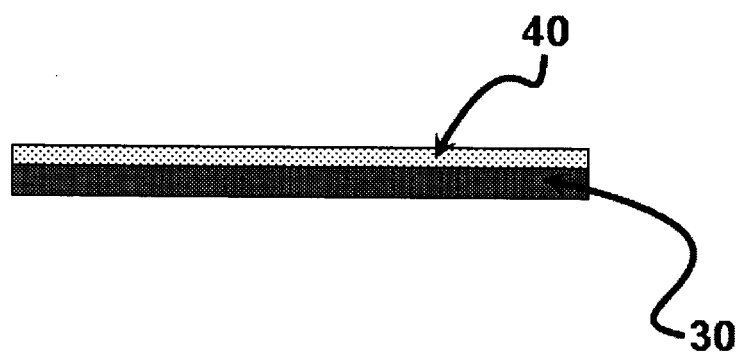
FIGS. 2 and 3 are a cross-sectional view of a dicing die bonding film according to one embodiment of the present invention.

FIG. 2 shows a cross-sectional view of a dicing die bonding film according to one embodiment of the present invention. As shown in FIG. 2, the dicing die bonding film of the present invention may comprise a dicing tape 30 and an adhesive portion 40 comprising a cured product of the epoxy composition formed on one side of the dicing tape 30.

Figure 3:
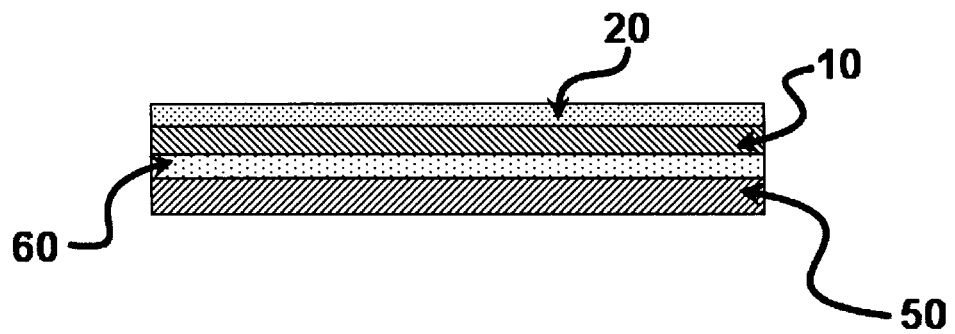

In one embodiment of the present invention, as shown in FIG. 3, the adhesive portion 40 of the dicing die bonding film is an adhesive film according to the present invention; and the dicing tape 30 may comprise a base film 50 and a pressure-sensitive adhesive layer 60 formed on the base film 50.

For the base film of a dicing tape, a film made of polyethylene, polypropylene, polytetrafluoroethylene, polyethylene terephthalate, polyurethane, ethylenevinyl acetone, ethylene-propylene copolymer, ethylene-acrylic acid ethyl copolymer, or ethylene-acrylic acid methyl copolymer, etc. may be used. If necessary, the surface of the base film may be treated by primers, corona, etching or UV. The surface of the base film may be primer-, corona-, etching- or UV-treated. Further, if it is intended to cure a cohesive agent by UV irradiation at the time of fixing pick-up, it is preferable to use a base film allowing light transmission. The base film thickness of a dicing tape is not specifically limited, however it is preferably 60 μm to 160 μm, and more preferably 80 μm to 120 μm, in terms of the handling property and efficiency of a packaging process.

For a pressure-sensitive adhesive layer 60 of a dicing tape, a conventional UV curable or heat curable cohesive agent may be used. When using a UV curable cohesive agent, it is irradiated with UV from the base film to increase cohesion and the glass transition temperature of the cohesive agent, thereby lowering cohesive power. When using a heat curable cohesive agent, it is heated to lower cohesive power.

The method for preparing a dicing die bonding film according to the present invention as described above is not specifically limited. For instance, a hot roll lamination or pressing method may be employed to the method, forming a dicing die bonding film by layering a dicing tape and an adhesive film. In terms of continuous processing and efficiency, a hot roll lamination method is preferred. The hot roll lamination process may be carried out at 10° C. to 100° C. under a pressure of 0.1 kgf/cm² to 10 kgf/cm², however it is not limited thereto.

Further, the present invention relates to a semiconductor wafer, wherein the adhesive portion of the dicing die bonding film as described above is attached to one side of the wafer, and the dicing tape of the dicing die bonding film is fixed on the wafer ring frame.

The semiconductor wafer according to the present invention may be fabricated by laminating an adhesive film of a dicing die bonding film onto the reverse side of the wafer at 0° C. to 180° C., and fixing the dicing tape to a wafer ring frame.

Figure 4:
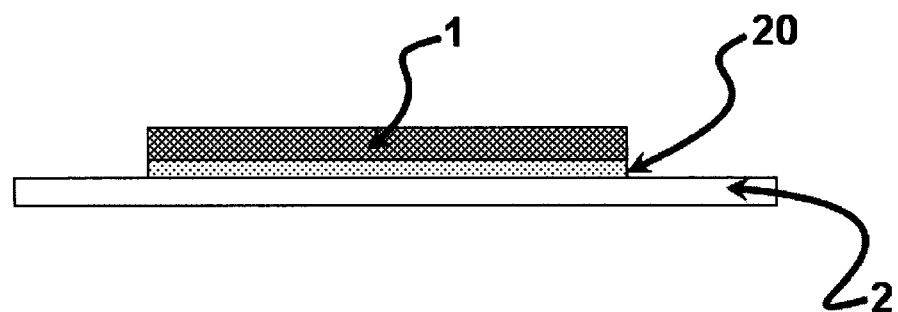
FIG. 4 is a cross-sectional view of a semiconductor device according to one embodiment of the present invention.

Still further, as shown in FIG. 4, the present invention relates to a semiconductor device comprising: a wiring board 2; an adhesive layer 20 comprising a cured product of the epoxy composition as described above attached to a chip mounting side of the wiring board; and a semiconductor chip 1 mounted on the adhesive layer.

Such a semiconductor device may be fabricated by various methods well-known in this field, and one embodiment of a semiconductor device fabrication process is described below.

Firstly, a semiconductor wafer having the foregoing dicing die bonding film attached thereto is completely cut into separate chips using a dicing device. When the dicing tape uses a UV curable cohesive agent, it is hardened by UV irradiation from the substrate side. When it uses a heat curable cohesive agent, it is hardened by heating. Such a UV or heat-cured cohesive agent does not closely adhere to an adhesive agent, therefore it makes pick-up of chips easy in a later process. If necessary, the dicing die bonding film may be expanded. An expanding process forms a space between the chips to a certain degree, thus making the pick-up process easier. Further, because of the expanding process, the cohesive layer becomes part of the adhesive layer, thereby improving the pick-up property. The pick-up process of chips is continuously carried out. The cohesive layers of the semiconductor wafer and a dicing die bonding film become peeled off, thus resulting in a chip having only an adhesive layer attached thereto. The obtained chip having an adhesive layer is attached to a substrate for a semiconductor device. The temperature for attaching the chip is generally 100° C. to 180° C.; the time for attachment is 0.5 to 3 seconds; and the pressure for attachment is 0.5 kg$_f$/cm² to 2 kg$_f$/cm².

After going through the above process, it is subjected to a wire bonding and a molding process, thereby obtaining a semiconductor device.

The method for fabrication of a semiconductor device is not limited just to the above-described process: optional processes may be further included, or the order of the process may be changed. For example the process may be conducted to the following orders: hardening of a cohesive layer→dicing→expanding; or dicing→expanding→hardening of a cohesive layer. After attaching a chip, a heating or a cooling process may further be included.

MODE FOR INVENTION

Hereinafter, the present invention is further illustrated through the following examples according to the present invention, and comparative examples. However, it should be noted that the scope of the present invention is by no means limited to these examples.

Preparation Example 1

A 4 neck reactor with a volume of 3L equipped with a stirrer, a nitrogen substitution device and a thermometer was charged with 200 g of butyl acrylate (BA), 200 g of ethyl acrylate, 140 g of acrylonitrile, 16 g of glycidyl methacrylate, 8 g of acrylic acid and 1500g of deionized distilled water. Then, 4 g of 4% polyvinyl alcohol (product name: NH-17, manufactured by Nippon ghosei) diluted in water as a suspending agent and 0.3 g of dodecyl mercaptan as a molecular weight regulator were added thereto, forming a mixture. The resulting mixture was purged with nitrogen gas, and the temperature was raised to 55 °C. When the set temperature was reached, 4 g of 2% diethylhexylperoxy dicarbonate (product name: TRIGONOX EHP, manufactured by Akzo Nobel) diluted in ethyl acetate as an initiator was added to the mixture to initiate polymerization. After 4hours had elapsed from the polymerization initiation, the reaction was stopped. The resulting product was washed several times with deionized distilled water, and then dried using a centrifuge and a vacuum oven, resulting in polymer beads with 90% yield. The weight average molecular weight of the obtained polymer measured by gel permeation chromatography was 750,000, and the molecular weight distribution was 3.0. Additionally, the glass transition temperature of the polymer measured by Differential Scanning Calorimeter (DSC) was 5°C . The obtained polymer beads were sufficiently dissolved in methylethylketone (MEK) for 3 hours before use Preparation Example 2

Polymer beads were prepared using the same method as in preparation example 1, except 200 g of butyl acrylate, 200 g of ethyl acrylate, 140 g of acrylonitrile, 16 g of glycidyl methacrylate and 1500 g of deionized distilled water were used. The weight average molecular weight of the resulting polymer was 800,000; the molecular weight distribution was 3.2; and the glass transition temperature was 5° C. A thermoplastic resin was prepared by dissolving the polymer beads in methylethylketone (MEK) for 10 hours, so that the polymer beads completely disappeared, and was kept in a swollen state.

Preparation Example 3

A thermoplastic resin was prepared using the same method as in preparation example 2, except that the polymer beads were sufficiently dissolved in a solvent for 3 days.

PREPARATION EXAMPLE 4

Polymer beads were prepared using the same method as in preparation example 2, except 150 g of butyl acrylate, 250 g of ethyl acrylate, 140 g of acrylonitrile, 16 g of glycidyl methacrylate, 8 g of acrylic acid and 1500 g of deionized distilled water were used. The weight average molecular weight of the resulting polymer was 770,000; the molecular weight distribution was 3.0; and the glass transition temperature was 25° C. The obtained polymer beads were sufficiently dissolved in methylethylketone (MEK) for 3 hours, before use.

Example 1

A resin varnish was prepared by mixing 100 parts by weight of an acrylic copolymer ($T_g$=5° C., $M_w$=750,000) containing a glycidyl group and a carboxyl group obtained in preparation example 1, 66 parts by weight of an aromatic epoxy resin (novolac epoxy resin) having a softening temperature of 80° C., 34 parts by weight of a phenol resin (phenol novolac resin) having a softening temperature of 90° C., 0.3 part by weight of 2-phenyl-4-methyl imidazole (2P4MZ) as a hardening accelerating agent and 15 parts by weight of fused silica having an average particle diameter of 75 mm as a filler in methylethylketone, and then stirring them.

The prepared resin varnish was coated on a 38 μm thick base film (releasing-treated polyester film; RS-21G, manufactured by SKC), dried at 110°C. for 3 minutes, thus preparing an adhesive film having a thickness of 20 μm. Next, a dicing tape (Lintec ADWILL D-175) was laminated to the resulting adhesive film, thereby preparing a dicing die bonding film.

Example 2

A dicing die bonding film was prepared by the same method as in example 1, except an epoxy group-containing acrylic copolymer ($T_g$=5° C., $M_w$=800,000) obtained in preparation example 2 was used as a thermoplastic resin.

Comparative Example 1

A dicing die bonding film was prepared by the same method as in example 1, except an acrylic copolymer ($T_g$=5° C., $M_w$=800,000) obtained in preparation example 3 was used as a thermoplastic resin.

Comparative Example 2

A resin varnish was prepared by the same method as in example 1, except an acrylic copolymer ($T_g$=25° C., $M_w$=770,000) obtained in preparation example 4 was used as a thermoplastic resin. Then, a dicing die bonding film was prepared by the same method as in example 1, except that the adhesive film was prepared by coating the resulting resin varnish to a 38 μm thick base film (releasing-treated polyester film; RS-21G, manufactured by SKC), drying it at 110° C. for 10 minutes.

The physical properties of the prepared epoxy composition were determined by the methods described below.

1. Determination of Gel Content

A basket-shaped 300 mesh SUS ($W_1$) was charged with a certain amount of an adhesive ($W_2$) prepared from the examples and comparative examples, soaked in THF, and maintained therein at 25° C. for 20 hours. The SUS was adjusted so as to just soak the adhesive enough, and the entire SUS was not soaked. Later, the SUS mesh was taken out and dried sufficiently enough to remove THF by evaporation. The weight of the SUS and undissolved adhesive in a swollen state (SUS mesh weight+weight of the undissolved adhesive agent in a swollen state=$W_3$) was measured, and the gel content was determined by the following general formula 2.

$$\text{Gel content (\%)} = \frac{W_3 - W_1}{W_2} \times 100 \quad \text{[General formula 2]}$$

2. Estimation of Tensile Properties at Room Temperature

To measure the elastic properties of an adhesive film, a Texture Analyzer (Stable Micro System, UK) was used to estimate the tensile properties of the adhesive film at room temperature. Specifically, an adhesive film was cut into a width of 10 mm and a length of 50 mm, thereby preparing a sample. Each end of the sample was taped, while leaving 25 mm of untaped part in the middle of the sample. Then, each taped end was fixed to the device, and the sample was elongated at a speed of 0.3 mm/sec, thereby allowing an elongation curve to be plotted. From the elongation curve, the initial slope of the elastic zone and the yield strength that is the turning point between the elastic zone and the plastic zone was found. When the yield strength obtained therefrom is high, it can be determined that the elastic properties are high; and when the yield strength is low, the elastic properties are also low.

3. Occurrence of Burrs

After laminating a dicing die bonding film at 50° C. on a 100 μm thick wafer using a wafer ring mounter, the resulting product was diced, at 40K rpm at a speed of 20 mm/sec using a dicing device to a chip size of 2 mm×2 mm. The number of burrs occurring on the die was measured, thereby determining the burr occurrence.

4. Determination of Tack Properties at High Temperature

A dicing die bonding film from the examples and comparative examples was placed on a hot plate with a surface temperature of 130° C. Its tack properties were measured by using the Texture Analyzer used in the above and a ball type probe having a diameter of 1 inch. The power applied to the probe was 800 gf; the contact time was 0.1 seconds; and the speed of taking off the probe was 0.1 mm/sec.

5. Estimation of Shear Strength at High Temperature

An adhesive film from the examples and comparative examples was laminated on the mirror side of a 5 mm×5 mm wafer having a thickness of about 600 μm to 700 μm. An adhesive film was prepared of which the size was as much as the size of a die that is obtained by dicing a wafer. Subsequently, a wafer die having the die bonding film was attached onto the SUS plate base at 130° C., and it was cured at 150° C. for 30 minutes. Next, using the Texture Analyzer, the strength was measured while extending the wafer die at 180° C., with the speed of 0.1 mm/sec, thereby estimating the shear strength at high temperature.

The results obtained from the above methods have been summarized in the following Table 1.

TABLE 1

|  | Example | | Comparative Example | |
|---|---|---|---|---|
|  | 1 | 2 | 1 | 2 |
| Thermoplastic resin | Pre. Ex. 1 (internal cross-linking) | Pre. Ex. 2 (internal-entanglement) | Pre. Ex. 3 (chain structure) | Pre. Ex. 4 (internal cross-linking) |
| Thermoplastic resin $T_g$ (° C.) | 5 | 5 | 5 | 25 |
| Gel content | 12 | 8 | 2 | 30 |
| Yield strength (gf) | 42 | 37 | 15 | 70 |
| Occurrence of burrs (%) | 1 | 2 | 13 | 2 |
| Tack property at high temperature (gf) | 95 | 93 | 108 | 15 |
| Shear strength at high temperature (gf) | 1,787 | 1,538 | 739 | 2,206 |

As it can be seen from Table 1 above, the adhesive film of the present invention showed a low burr occurrence owing to its excellent elastic properties, while exhibiting excellent adhesive properties. Specifically, in examples 1 and 2 which exhibited a gel content right after coating of 12% and 8% respectively, excellent elastic and adhesive properties at high temperature were maintained, together with a low glass transition temperature of the thermoplastic resin. In comparative example 1, in which the gel content was too low, the adhesive property at high temperature was good owing to the low glass transition temperature, however burrs frequently occurred owing to its low elastic properties. Further, it is expected that it would frequently cause problems such as die cut shift during a packaging process, owing to the reduced shear strength at high temperature. In the case of comparative example 2, wherein the gel content was too high, although the occurrence of burrs was quite low, the adhesive properties were deteriorated due to an excessively high glass transition temperature, and it is expected that the circuit filling property would be lowered due to its excessively high gel content.

The invention claimed is:

1. An epoxy composition comprising:
   (a) a thermoplastic resin which has an internally-cross-linked structure and is a polymer of monomers comprising (meth)acrylic acid,
   (b) an epoxy resin, and
   (c) a hardening agent,
   wherein the epoxy composition satisfies the following general formula 1:

$$X = 5\% \text{ to } 20\% \text{ by weight} \quad \text{[General formula 1]}$$

wherein X is the content of gel measured after drying the epoxy composition at a temperature of 110° C. for 3 minutes.

2. The epoxy composition according to claim 1, wherein the gel content is not less than 5% by weight and less than 20% by weight.

3. The epoxy composition according to claim 1, wherein the thermoplastic resin has a glass transition temperature of −30° C. to 50° C. before hardening.

4. The epoxy composition according to claim 1, wherein (a) the theoplastic resin has a weight average molecular weight of 100,000 to 2,500,000.

5. The epoxy composition according to claim 1, wherein the monomers further comprise at least one monomer selected from the group consisting of a glycidyl-group containing monomer, a hydroxyl-group containing monomer, a carboxyl-group containing monomer and a nitrile-group containing monomer.

6. The epoxy composition according to claim 1, wherein (b) the epoxy resin has a softening temperature of 50° C. to 100° C. before hardening.

7. The epoxy composition according to claim 1, wherein (b) the epoxy resin has an epoxy equivalent weight of 180 to 1,000.

8. The epoxy composition according to claim 1, wherein (b) the epoxy resin is one or more selected from the group consisting of cresol novolak epoxy resins, bisphenol A novolak epoxy resins, phenol novolak epoxy resins, 4-functional epoxy resins, biphenyl epoxy resins, triphenolmethane epoxy resins, alkyl-modified triphenolmethane resins, naphthalene epoxy resins, dicyclopentadiene epoxy resins and dicyclopentadiene-modified phenol epoxy resins.

9. The epoxy composition according to claim 1, wherein (b) the epoxy resin is comprised in an amount of 10 to 200 parts by weight, relative to 100 parts by weight of (a) the thermoplastic resin.

10. The epoxy composition according to claim 1, wherein (c) the hardening agent is a polyfunctional phenol resin having a hydroxyl-group equivalent weight of 100 to 1,000.

11. The epoxy composition according to claim 10, wherein (c) the hardening agent has a softening temperature of 50° C. to 150° C.

12. The epoxy composition according to claim 10, wherein the polyfunctional phenol resin is one or more selected from the group consisting of bisphenol A resin, phenol novolak resin, cresol novolak resin, bisphenol A novolak resin, phenol aralkyl resin, multifunction novolak resin, dicyclopentadiene phenol novolak resin, amino triazine phenol novolak resin, polybutadiene phenol novolak resin and biphenyl resin.

13. The epoxy composition according to claim 1, wherein (c) the hardening agent is comprised in an equivalent ratio of 0.4 to 2, relative to an epoxy equivalent weight of (b) the epoxy resin.

* * * * *